(12) United States Patent
Isobe et al.

(10) Patent No.: US 12,328,924 B2
(45) Date of Patent: Jun. 10, 2025

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Yasuhiro Isobe, Tokyo (JP); Hung Hung, Kawasaki Kanagawa (JP); Akira Yoshioka, Yokohama Kanagawa (JP); Toru Sugiyama, Tokyo (JP); Masaaki Onomura, Setagaya Tokyo (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 761 days.

(21) Appl. No.: 17/468,315

(22) Filed: Sep. 7, 2021

(65) Prior Publication Data
US 2022/0293745 A1    Sep. 15, 2022

(30) Foreign Application Priority Data
Mar. 10, 2021  (JP) ................. 2021-038520

(51) Int. Cl.
*H10D 30/47* (2025.01)
*H10D 64/00* (2025.01)
*H10D 64/01* (2025.01)

(52) U.S. Cl.
CPC ......... *H10D 64/112* (2025.01); *H10D 30/475* (2025.01); *H10D 30/4755* (2025.01); *H10D 64/01* (2025.01); *H10D 64/111* (2025.01)

(58) Field of Classification Search
CPC ............. H04L 29/7787; H04L 29/7786; H04L 29/404; H04L 29/402; H10D 30/475; H10D 30/4755; H10D 64/111; H10D 64/112
See application file for complete search history.

(56) References Cited

U.S. PATENT DOCUMENTS 10,700,188 B2   6/2020  Chikamatsu
2007/0215899 A1   9/2007  Herman
(Continued)

FOREIGN PATENT DOCUMENTS

JP    2009-530862 A    8/2009
JP    2015-072962 A    4/2015
(Continued)

OTHER PUBLICATIONS

Cheng, K-Y. "Comparative study on performance of AlGaN/GaN MS-HEMTs with SiNx, SiOx, and SiNO surface passivation" Solid-State Elec. vol. 170 published Aug. 2020 pp. 107824 1-5 (Year: 2020).*

*Primary Examiner* — Grant S Withers
(74) *Attorney, Agent, or Firm* — Knobbe, Martens, Olson & Bear, LLP

(57) ABSTRACT

A semiconductor device includes a first nitride semiconductor layer, a second nitride semiconductor layer provided on the first nitride semiconductor layer, the second nitride semiconductor layer having a band gap larger than the first nitride semiconductor layer, a first electrode provided on the second nitride semiconductor layer, a second electrode provided on the second nitride semiconductor layer, a first insulating film provided between the first electrode and the second electrode on the second nitride semiconductor layer, the first insulating film being in connect with the second nitride semiconductor layer and including a first insulating material, a second insulating film provided on the second nitride semiconductor layer between the first electrode and the first insulating film, on the first insulating film, and on the second nitride semiconductor layer between the first insulating film and the second electrode, the second insulating film including a second insulating material, a third electrode provided on the second insulating film between the first electrode and the first insulating film, and a fourth (Continued)

electrode including a first electrode portion and a second electrode portion, the first electrode portion being provided on the second insulating film between the third electrode and the first insulating film, and the second electrode portion being provided on the second insulating film on the first insulating film and being electrically connected to the first electrode portion.

16 Claims, 10 Drawing Sheets

(56) References Cited

U.S. PATENT DOCUMENTS

| | | |
|---|---|---|
| 2019/0288081 A1 | 9/2019 | Shindome et al. |
| 2020/0091331 A1 | 3/2020 | Hung et al. |
| 2020/0295171 A1 | 9/2020 | Hung et al. |
| 2021/0043724 A1* | 2/2021 | Wu ....................... H01L 29/432 |
| 2021/0175350 A1* | 6/2021 | Iucolano ............. H01L 29/7786 |

FOREIGN PATENT DOCUMENTS

| | | |
|---|---|---|
| JP | 2015-170821 A | 9/2015 |
| JP | 2019-087740 A | 6/2019 |
| JP | 2019-161001 A | 9/2019 |
| JP | 2020-047741 A | 3/2020 |
| JP | 2020-150193 A | 9/2020 |

* cited by examiner

SEMICONDUCTOR DEVICE

CROSS-REFERENCE TO RELATED APPLICATION

This application is based upon and claims the benefit of priority from Japanese Patent Application No. 2021-038520, filed on Mar. 10, 2021, the entire contents of which are incorporated herein by reference.

FIELD

Embodiments described herein relate generally to a semiconductor device.

BACKGROUND

Group III nitrides, for example, gallium nitride (GaN)-based semiconductors are expected as materials for next-generation power semiconductor devices. The GaN-based semiconductor has a band gap larger than that of silicon (Si). Thus, a GaN-based semiconductor device can realize a power semiconductor device having a small size and a high withstand voltage as compared with a silicon (Si) semiconductor device. Accordingly, since a parasitic capacitance can be reduced, a high-speed driving power semiconductor device can be realized.

DETAILED DESCRIPTION

Figure 1:
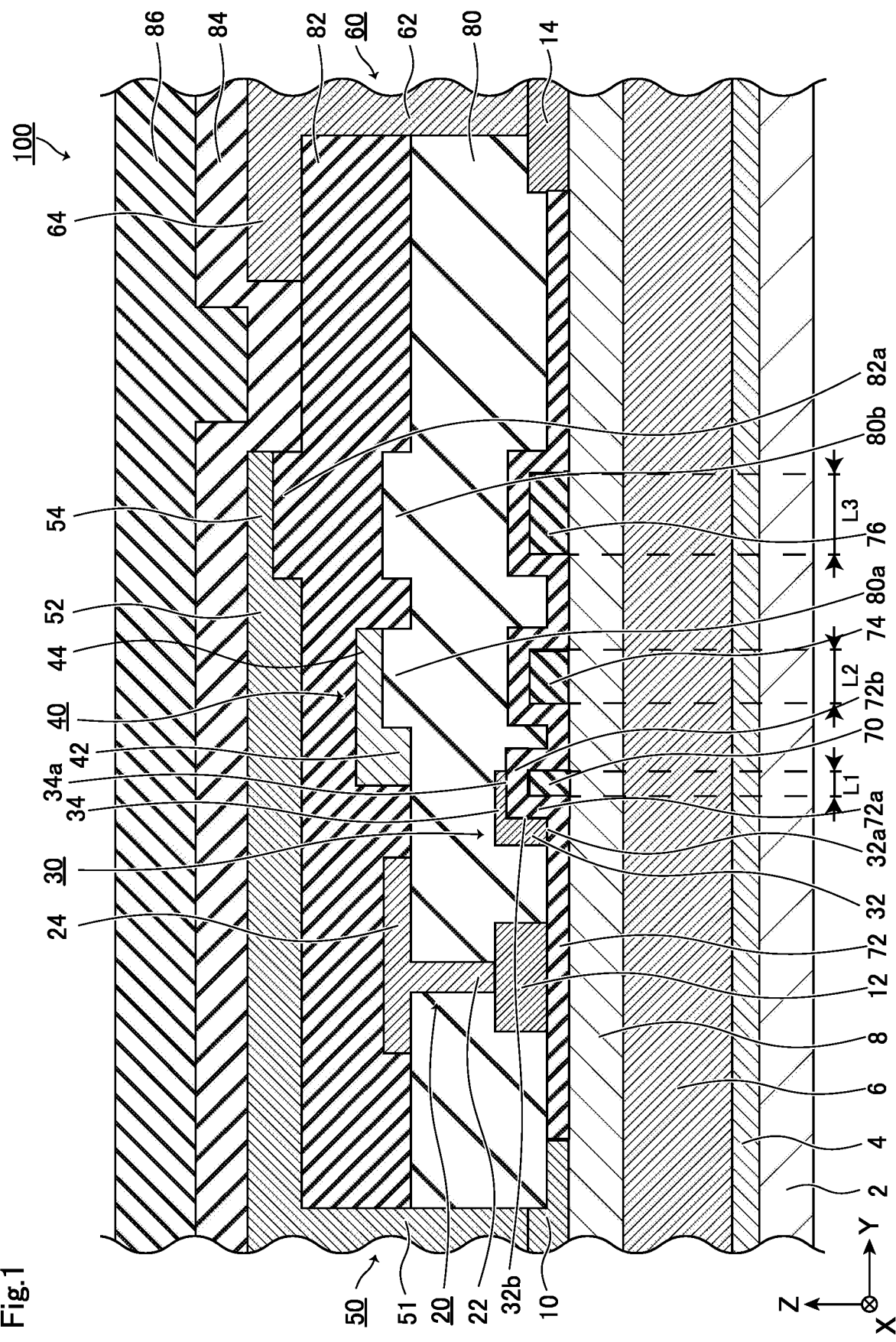
FIG. 1 is a schematic cross-sectional view of a semiconductor device according to an embodiment.

Hereinafter, an embodiment of the present disclosure will be described with reference to the drawings. In the following description, the same members and the like are given by the same reference numerals, and the description of the members and the like once described will be omitted as appropriate.

In the present specification, in order to show a locational relationship between components and the like, an upward direction of the drawing is described as "upper" and a downward direction of the drawing is described as "lower". In the present specification, the terms "upper" and "lower" are not necessarily terms indicating a relationship with a direction of gravity.

Embodiment

A semiconductor device according to an embodiment includes
a first nitride semiconductor layer; a second nitride semiconductor layer provided on the first nitride semiconductor layer and the second nitride semiconductor layer having a band gap larger than the first nitride semiconductor layer; a first electrode provided on the second nitride semiconductor layer; a second electrode provided on the second nitride semiconductor layer; a first insulating film provided between the first electrode and the second electrode on the second nitride semiconductor layer, the first insulating film being in contact with the second nitride semiconductor layer and the first insulating film including a first insulating material; a second insulating film provided on the second nitride semiconductor layer between the first electrode and the first insulating film, the second insulating film being provided on the first insulating film, the second insulating film being provided on the second nitride semiconductor layer between the first insulating film and the second electrode and the second insulating film including a second insulating material; a third electrode provided on the second insulating film between the first electrode and the first insulating film; and a fourth electrode including a first electrode portion and a second electrode portion, the first electrode portion being provided on the second insulating film between the third electrode and the first insulating film, the second electrode portion being provided on the second insulating film on the first insulating film and the second electrode portion being electrically connected to the first electrode portion. And a semiconductor device according to an embodiment includes a first nitride semiconductor layer; a second nitride semiconductor layer provided on the first nitride semiconductor layer and the second nitride semiconductor layer having a band gap larger than the first nitride semiconductor layer; a first electrode provided on the second nitride semiconductor layer; a second electrode provided on the second nitride semiconductor layer; a first insulating film provided between the first electrode and the second electrode on the second nitride semiconductor layer, the first insulating film being in contact with the second nitride semiconductor layer and the first insulating film including a first insulating material; a second insulating film provided on the second nitride semiconductor layer between the first electrode and the first insulating film, the second insulating film being provided on the first insulating film, the second insulating film being provided on the second nitride semiconductor layer between the first insulating film and the second electrode and the second insulating film including a second insulating material; a third electrode provided on the second insulating film between the first electrode and the first insulating film; a fourth electrode including a first electrode portion and a second electrode portion, the first electrode portion being provided above the second insulating film between the third electrode and the first insulating film, the second electrode portion being provided above the second insulating film on the first insulating film and the second electrode portion being electrically connected to the first electrode portion;

and a fifth insulating film provided between the fourth electrode and the second insulating film.

FIG. 1 is a schematic cross-sectional view of a semiconductor device 100 according to the embodiment.

The semiconductor device 100 according to the embodiment is a high electron mobility transistor (HEMT) using a nitride semiconductor such as gallium nitride (GaN), aluminum gallium nitride (AlGaN), or indium gallium nitride (InGaN). The semiconductor device 100 according to the embodiment has a lateral device structure using the nitride semiconductor.

The semiconductor device 100 includes a substrate 2, a buffer layer 4, a first nitride semiconductor layer 6, a second nitride semiconductor layer 8, a source electrode (an example of a first electrode) 10, a gate electrode (an example of a third electrode) 12, a drain electrode (an example of a second electrode) 14, a gate field plate electrode 20, a first field plate electrode (an example of a fourth electrode) 30, a second field plate electrode (an example of a fifth electrode) 40, a source field plate electrode (an example of a sixth electrode) 50, a drain field plate electrode 60, a first insulating film 70, a second insulating film 72, a third insulating film 74, a fourth insulating film 76, a fifth insulating film 80, a sixth insulating film 82, a seventh insulating film 84, and an eighth insulating film 86.

For example, a silicon (Si) substrate or a sapphire substrate is used as the substrate 2.

The buffer layer 4 is provided on the substrate 2. The buffer layer 4 alleviates lattice mismatch with the substrate 2. The buffer layer 4 includes, for example, a multilayer structure of aluminum gallium nitride ($Al_WGa_{1-W}N$ ($0<W<1$)).

The first nitride semiconductor layer 6 is provided on the buffer layer 4. The first nitride semiconductor layer 6 is, for example, undoped $Al_XGa_{1-X}N$ ($0 \leq X < 1$). More specifically, the first nitride semiconductor layer 6 is, for example, undoped GaN. The first nitride semiconductor layer 6 functions as a channel layer. A film thickness of the first nitride semiconductor layer 6 is, for example, equal to or more than 1 μm and equal to or less than 10 μm.

The second nitride semiconductor layer 8 is provided on the first nitride semiconductor layer 6. A band gap of the second nitride semiconductor layer 8 is larger than a band gap of the first nitride semiconductor layer 6. The second nitride semiconductor layer 8 is, for example, undoped $Al_YGa_{1-Y}N$ ($0<Y \leq 1$, $X<Y$). More specifically, the second nitride semiconductor layer 8 is, for example, undoped $Al_{0.2}Ga_{0.8}N$. The second nitride semiconductor layer 8 functions as a barrier layer. A film thickness of the second nitride semiconductor layer 8 is, for example, equal to or more than 15 nm and equal to or less than 50 nm.

A heterojunction interface is provided between the first nitride semiconductor layer 6 and the second nitride semiconductor layer 8. When the semiconductor device 100 is turned on, a two-dimensional electron gas (2DEG) is formed at the heterojunction interface and becomes a carrier.

In the embodiment, an X direction, a Y direction vertically crossing the X direction, and a Z direction vertically crossing the X direction and the Y direction are defined. The Z direction is a direction in which the substrate 2, the buffer layer 4, the first nitride semiconductor layer 6, and the second nitride semiconductor layer 8 are stacked. The substrate 2, the buffer layer 4, the first nitride semiconductor layer 6, and the second nitride semiconductor layer 8 are provided in parallel to a plane including an X axis parallel to the X direction and a Y axis parallel to the Y direction, that is, an XY plane. An interface between the substrate 2 and the buffer layer 4, an interface between the buffer layer 4 and the first nitride semiconductor layer 6, and an interface between the first nitride semiconductor layer 6 and the second nitride semiconductor layer 8 are provided in parallel to the XY plane. The Y direction is a direction in which the carrier of the semiconductor device 100 as the HEMT flows. In other words, the Y direction is a gate length direction of the semiconductor device 100. The Y direction is an example of a predetermined direction. The X direction is a gate width direction of the semiconductor device 100.

The source electrode 10 is provided on the second nitride semiconductor layer 8. The source electrode 10 functions as a source electrode of the semiconductor device 100. The source electrode 10 includes, for example, a stacked structure of titanium (Ti) and aluminum (Al).

The drain electrode 14 is provided on the second nitride semiconductor layer 8. The drain electrode 14 functions as a drain electrode of the semiconductor device 100. The drain electrode 14 includes, for example, a stacked structure of titanium (Ti) and aluminum (Al).

The first insulating film 70 is provided between the source electrode 10 and the drain electrode 14 on the second nitride semiconductor layer 8. The first insulating film 70 is in direct contact with the second nitride semiconductor layer 8. The first insulating film 70 contains a first insulating material. Here, the first insulating material is, for example, silicon oxide (SiO), silicon oxynitride (SiON), carbon-containing silicon oxide (SiOC), silicon nitride (SiN), aluminum nitride (AlN), or aluminum oxide (AlO). A film thickness of the first insulating film 70 in the Z direction is, for example, equal to or more than 10 nm and equal to or less than 100 nm.

The third insulating film 74 is provided between the first insulating film 70 and the drain electrode 14 on the second nitride semiconductor layer 8. The third insulating film 74 is in direct contact with the second nitride semiconductor layer 8. The third insulating film 74 contains a first insulating material. A film thickness of the third insulating film 74 in the Z direction is, for example, equal to or more than 10 nm and equal to or less than 100 nm.

The fourth insulating film 76 is provided between the third insulating film 74 and the drain electrode 14 on the second nitride semiconductor layer 8. The fourth insulating film 76 is in direct contact with the second nitride semiconductor layer 8. The fourth insulating film 76 contains a first insulating material. A film thickness of the fourth insulating film 76 in the Z direction is, for example, equal to or more than 10 nm and equal to or less than 100 nm.

A length $L_1$ of the first insulating film 70 in a direction parallel to the Y direction is preferably equal to or less than a length $L_2$ of the third insulating film 74 in the direction parallel to the Y direction. The length $L_2$ of the third insulating film 74 in the direction parallel to the Y direction is preferably equal to or less than a length $L_3$ of the fourth insulating film 76 in the direction parallel to the Y direction. In other words, $L_1 \leq L_2 \leq L_3$ is preferable. For example, the length $L_1$ of the first insulating film 70 in the direction parallel to the Y direction is equal to or more than 0.5 μm and equal to or less than 1 μm. For example, the length $L_2$ of the third insulating film 74 in the direction parallel to the Y direction is equal to or more than 0.5 μm and equal to or less than 2 μm. For example, the length $L_3$ of the fourth insulating film 76 in the direction parallel to the Y direction is equal to or more than 0.5 μm and equal to or less than 3 μm. However, the length $L_1$ of the first insulating film 70 in the direction parallel to the Y direction, the length $L_2$ of the third insulating film 74 in the direction parallel to the Y direction, and the length $L_3$ of the fourth insulating film 76 in the direction parallel to the Y direction are not limited to the above-described lengths.

The second insulating film 72 is provided on the second nitride semiconductor layer 8 between the source electrode 10 and the first insulating film, on a side surface of the first insulating film 70, on the first insulating film 70, on the second nitride semiconductor layer 8 between the first insulating film 70 and the third insulating film 74, on a side surface of the third insulating film 74, on the third insulating film 74, on the second nitride semiconductor layer 8 between the third insulating film 74 and the fourth insulating film 76, on a side surface of the fourth insulating film 76, on the fourth insulating film 76, and between the fourth insulating film 76 and the drain electrode 14. In other words, the third insulating film 74 is provided between the first insulating film 70 and the drain electrode 14 and between the second nitride semiconductor layer 8 and the second insulating film 72. The fourth insulating film 76 is provided between the third insulating film 74 and the drain electrode 14 and between the second nitride semiconductor layer 8 and the second insulating film 72. The second insulating film 72 contains a second insulating material. Here, the second insulating material is, for example, silicon oxide (SiO), silicon oxynitride (SiON), carbon-containing silicon oxide (SiOC), silicon nitride (SiN), aluminum nitride (AlN), or aluminum oxide (AlO). For example, the second insulating material is silicon nitride (SiN) formed by a plasma chemical vapor deposition (CVD) method, a low-pressure chemical vapor deposition (LPCVD) method, or an atomic layer deposition (ALD) method.

The gate electrode 12 is provided on the second insulating film 72 between the source electrode 10 and the first insulating film 70. The gate electrode 12 includes, for example, a stacked structure of nickel (Ni) and gold (Au), titanium nitride (TiN), or polycrystalline silicon (Poly-Si). A bottom surface of the gate electrode 12 is preferably in contact with the second insulating film 72.

The first field plate electrode 30 includes a first electrode portion 32 and a second electrode portion 34. The first electrode portion 32 is provided on the second insulating film 72 between the gate electrode 12 and the first insulating film 70. A bottom surface 32a of the first electrode portion 32 is in contact with the second insulating film 72. A side surface 32b of the first electrode portion 32 is in contact with the second insulating film 72a provided on the side surface of the first insulating film 70. The second electrode portion 34 is provided on the second insulating film 72 on the first insulating film 70. One end of the second electrode portion 34 is electrically connected to the first electrode portion 32. In other words, when viewed from above, the other end of the second electrode portion 34 is provided between the first electrode portion 32 and the drain electrode 14. A bottom surface 34a of the second electrode portion 34 is in contact with the second insulating film 72b provided on the first insulating film 70. The first field plate electrode 30 is electrically connected to the source electrode 10 by using, for example, a wiring provided in the gate width direction (not illustrated). The first field plate electrode 30 is used for relaxing an electric field in the semiconductor device 100. The first field plate electrode 30 includes, for example, a stacked structure of nickel (Ni) and gold (Au), titanium nitride (TiN), or polycrystalline silicon (Poly-Si).

A length of the first insulating film 70 in the Y direction is shorter than a length of the first field plate electrode 30 in the Y direction.

The fifth insulating film 80 is provided on the second insulating film 72, on the gate electrode 12, and on the first field plate electrode 30. The fifth insulating film 80 contains, for example, silicon oxide (SiO), silicon oxynitride (SiON), carbon-containing silicon oxide (SiOC), silicon nitride (SiN), aluminum nitride (AlN), or aluminum oxide (AlO). However, the material contained in the fifth insulating film 80 is not limited thereto.

The gate field plate electrode 20 includes a first gate field plate electrode portion 22 and a second gate field plate electrode portion 24. For example, one end of the first gate field plate electrode portion 22 is electrically connected to an upper surface of the gate electrode 12. The first gate field plate electrode portion 22 extends upward. The second gate field plate electrode portion 24 is electrically connected to the other end of the first gate field plate electrode portion 22. The second gate field plate electrode portion 24 extends in the gate length direction. However, an aspect of the gate field plate electrode 20 is not limited thereto. The gate field plate electrode 20 is used for relaxing the electric field in the semiconductor device 100. The gate field plate electrode 20 includes, for example, aluminum (Al), copper (Cu), tungsten (W), titanium nitride (TiN), or a stacked structure of titanium (Ti) and aluminum (Al).

The second field plate electrode 40 includes a third electrode portion 42 and a fourth electrode portion 44. The third electrode portion 42 is provided above the second insulating film 72 between the first insulating film 70 and the third insulating film 74. For example, the third electrode portion 42 is provided on the fifth insulating film 80. The fourth electrode portion 44 is provided above the second insulating film 72 on the third insulating film 74. For example, the fourth electrode portion 44 is provided above the third insulating film 74 and on a fifth insulating film 80a in which a part of the fifth insulating film 80 protrudes upward. One end of the fourth electrode portion 44 is electrically connected to the third electrode portion 42. When viewed from above, the other end of the fourth electrode portion 44 is provided between the third electrode portion 42 and the drain electrode 14. The second field plate electrode 40 is electrically connected to the source electrode 10 by using, for example, a wiring provided in the gate width direction (not illustrated). The second field plate electrode 40 is used for relaxing the electric field in the semiconductor device 100. The second field plate electrode 40 includes, for example, aluminum (Al), copper (Cu), tungsten (W), titanium nitride (TiN), or a stacked structure of titanium (Ti) and aluminum (Al).

The sixth insulating film 82 is provided on the fifth insulating film 80, on the second gate field plate electrode portion 24, and on the second field plate electrode 40. The sixth insulating film 82 contains, for example, silicon oxide (SiO), silicon oxynitride (SiON), carbon-containing silicon oxide (SiOC), silicon nitride (SiN), aluminum nitride (AlN), or aluminum oxide (AlO). However, the material contained in the sixth insulating film 82 is not limited thereto.

The source field plate electrode 50 includes an electrode portion 51, a fifth electrode portion 52, and a sixth electrode portion 54. The electrode portion 51 is electrically connected to the source electrode 10. One end of the electrode portion 51 is provided on, for example, the source electrode 10, and is electrically connected to the source electrode 10. One end of the fifth electrode portion 52 is electrically connected to the other end of the electrode portion 51. The fifth electrode portion 52 is provided above the source electrode 10, above the gate electrode 12, above the first insulating film 70, above the third insulating film 74, and above the second insulating film 72 between the third insulating film 74 and the fourth insulating film 76. The sixth electrode portion 54 is provided, for example, on the sixth insulating film 82. For example, the sixth electrode portion 54 is provided on the sixth insulating film 82a in which a part of the sixth insulating film 82 protrudes upward and above the fifth insulating film 80a in which a part of the fifth insulating film 80 protrudes upward. The sixth insulating film 82a is provided above a fifth insulating film 80b above the fourth insulating film 76. The source field plate electrode 50 is used for relaxing the electric field in the semiconductor device 100. The source field plate electrode 50 includes, for example, aluminum (Al), copper (Cu), tungsten (W), titanium nitride (TiN), or a stacked structure of titanium (Ti) and aluminum (Al).

The drain field plate electrode 60 includes a first drain field plate electrode portion 62 and a second drain field plate electrode portion 64. The first drain field plate electrode portion 62 is electrically connected to the drain electrode 14. One end of the first drain field plate electrode portion 62 is provided, for example, on the drain electrode 14. One end of the first drain field plate electrode portion 62 is electrically connected to, for example, an upper surface of the drain electrode 14. One end of the second drain field plate electrode portion 64 is electrically connected to, for example, the other end of the first drain field plate electrode portion 62. The second drain field plate electrode portion 64 extends, for example, toward the source electrode 10. The second drain field plate electrode portion 64 is provided, for example, on the sixth insulating film 82. The drain field plate electrode 60 is used for relaxing the electric field in the semiconductor device 100. The drain field plate electrode 60 includes, for example, aluminum (Al), copper (Cu), tungsten (W), titanium nitride (TiN), or a stacked structure of titanium (Ti) and aluminum (Al).

The seventh insulating film 84 is provided on the sixth electrode portion 54 and the second drain field plate electrode portion 64 on the sixth insulating film 82. The seventh insulating film 84 contains, for example, silicon oxide (SiO), silicon oxynitride (SiON), carbon-containing silicon oxide (SiOC), silicon nitride (SiN), aluminum nitride (AlN), or aluminum oxide (AlO). However, the material contained in the seventh insulating film 84 is not limited thereto.

The eighth insulating film 86 is provided on the seventh insulating film 84. The eighth insulating film 86 contains, for example, silicon oxide (SiO), silicon oxynitride (SiON), carbon-containing silicon oxide (SiOC), silicon nitride (SiN), aluminum nitride (AlN), aluminum oxide (AlO), benzocyclobutene (BCB), or polyimide. However, the material contained in the eighth insulating film 86 is not limited thereto.

The shapes of the insulating films of the first insulating film 70, the second insulating film 72, the third insulating film 74, the fourth insulating film 76, the fifth insulating film 80, the sixth insulating film 82, the seventh insulating film 84, and the eighth insulating film 86 and the materials contained in the first insulating film 70, the second insulating film 72, the third insulating film 74, the fourth insulating film 76, the fifth insulating film 80, the sixth insulating film 82, the seventh insulating film 84, and the eighth insulating film 86 can be clarified by analysis using a scanning electron microscope (SEM), a transmission electron microscope (TEM), and an energy dispersive X-ray spectroscopy (EDX).

The first insulating material and the second insulating material are preferably different materials. Here, "being different materials" includes, for example, a case where both the first insulating material and the second insulating material are silicon nitride, but a ratio of silicon to nitrogen is different between the first insulating material and the second insulating material. Here, "being different materials" includes, for example, a case where both the first insulating material and the second insulating material are silicon oxide, but a ratio of silicon to oxygen is different between the first insulating material and the second insulating material.

A dielectric constant of the first insulating film 70, the third insulating film 74, or the fourth insulating film 76 is preferably lower than a dielectric constant of the second insulating film 72. In other words, a dielectric constant of the first insulating material is preferably lower than a dielectric constant of the second insulating material.

The film thickness of the first insulating film 70, the third insulating film 74, or the fourth insulating film 76 in the Z direction is preferably equal to or more than 10 nm and equal to or less than 100 nm.

The length of the first insulating film 70 in the Y direction is preferably shorter than the length of the first field plate electrode 30 in the Y direction.

A length of the third insulating film 74 in the Y direction is preferably shorter than a length of the second field plate electrode 40 in the Y direction.

A length of the fourth insulating film 76 in the Y direction is preferably shorter than a length of the source field plate electrode 50 in the Y direction.

Figure 2:
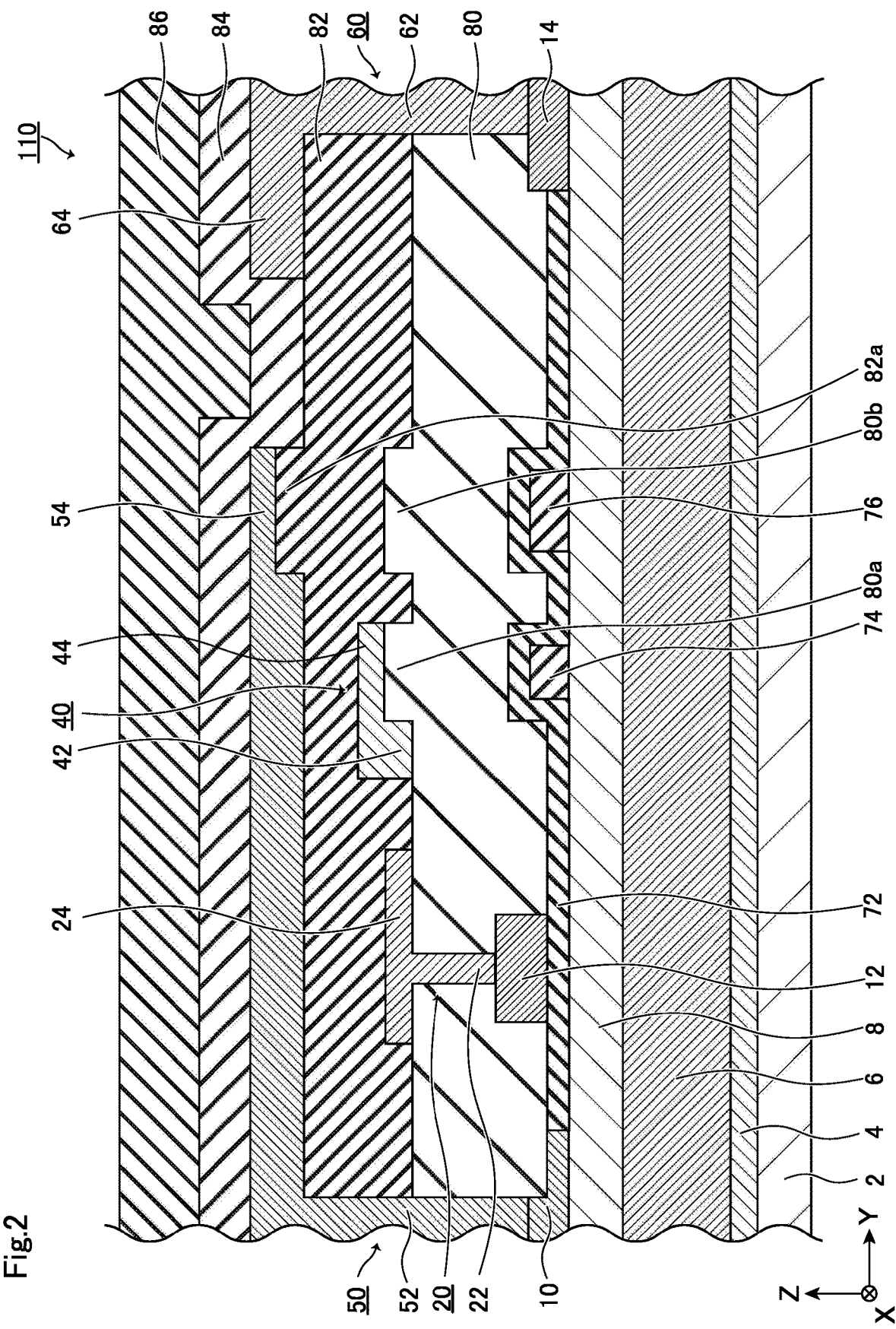
FIG. 2 is a schematic cross-sectional view of a semiconductor device according to another aspect of the embodiment.

FIG. 2 is a schematic cross-sectional view of a semiconductor device 110 according to another aspect of the embodiment. In the semiconductor device 110, the first insulating film 70 and the first field plate electrode 30 are not provided. Such a semiconductor device can also be preferably implemented. In the case of the semiconductor device 110, the second field plate electrode 40 is an example of a fourth electrode, the third electrode portion 42 is an example of a first electrode portion, the fourth electrode portion 44 is an example of a second electrode portion, the source field plate electrode 50 is an example of a fifth electrode, the fifth electrode portion 52 is an example of a third electrode portion, the sixth electrode portion 54 is an example of a fourth electrode portion, the third insulating film 74 is an example of the first insulating film, and the fourth insulating film 76 is an example of the third insulating film.

FIGS. 3 to 8 are schematic cross-sectional views illustrating main parts of a process of manufacturing the semiconductor device 100 according to the embodiment.

Figure 3:
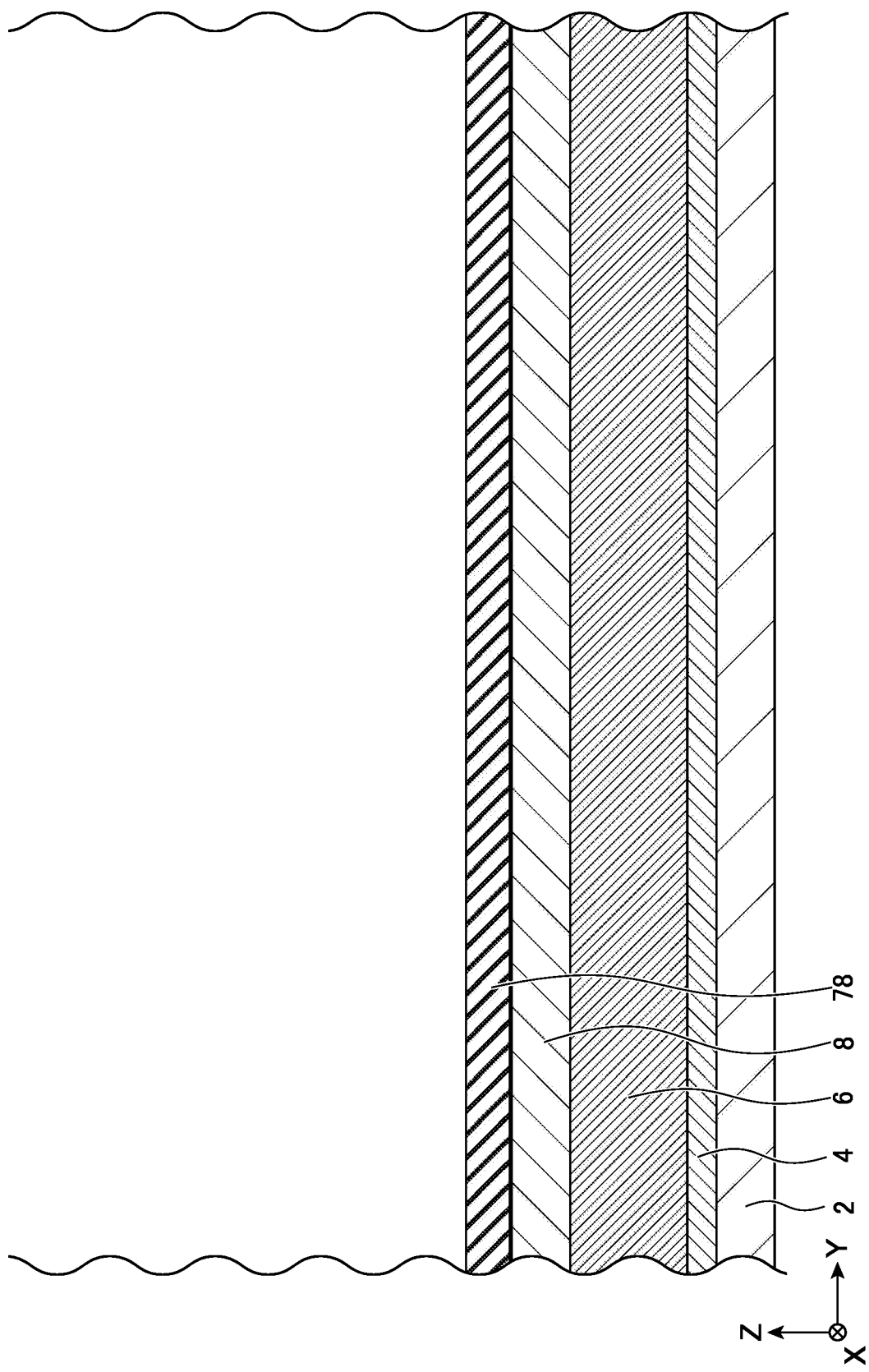
FIG. 3 is a schematic cross-sectional view illustrating a main part of a process of manufacturing the semiconductor device according to the embodiment.

First, the buffer layer 4, the first nitride semiconductor layer 6, and the second nitride semiconductor layer 8 are formed on the substrate 2 by, for example, a metal organic chemical vapor deposition (MOCVD) method. Subsequently, an insulating film 78 containing a first insulating material is formed on the second nitride semiconductor layer 8 (FIG. 3).

Figure 4:
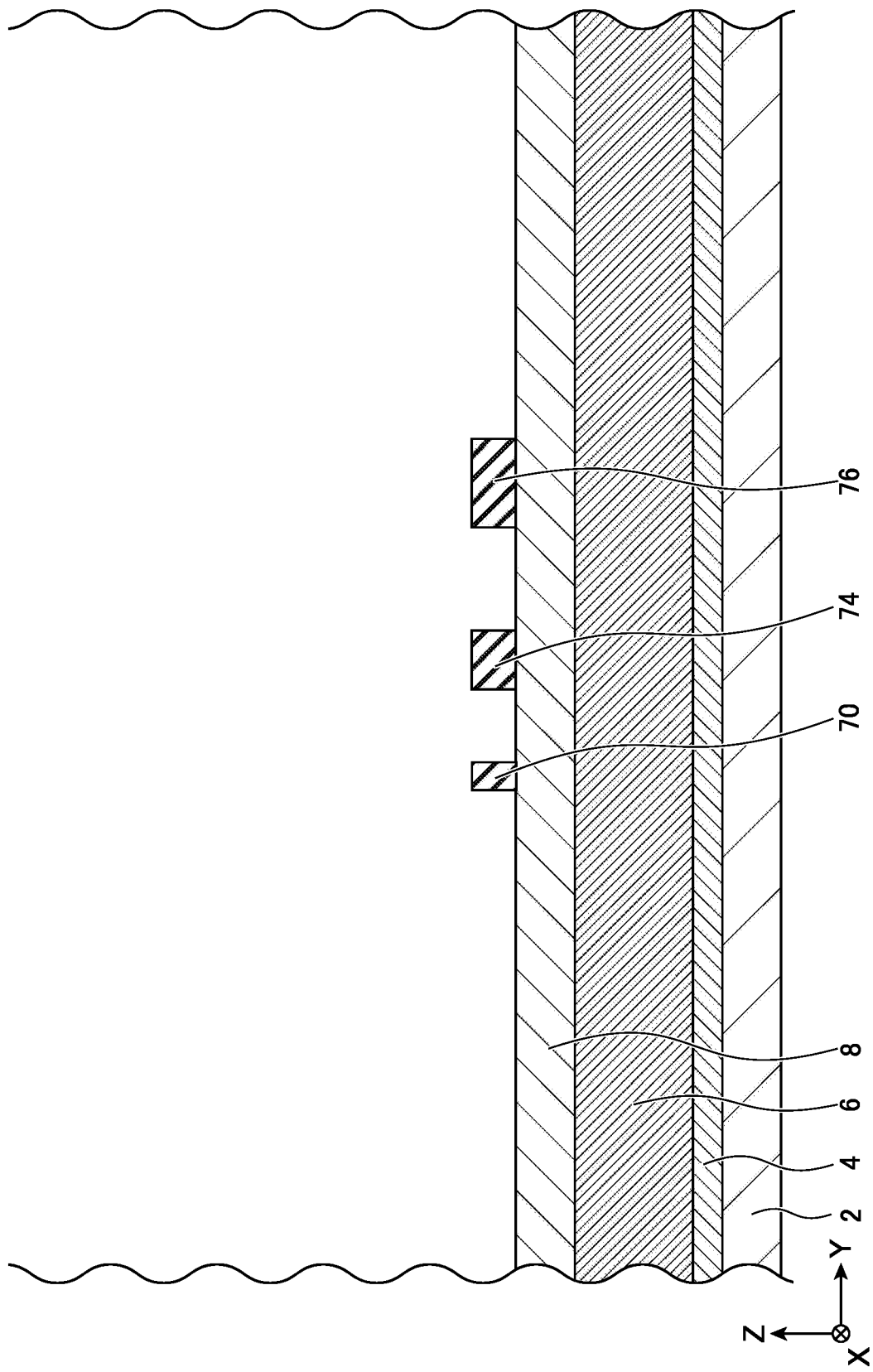
FIG. 4 is a schematic cross-sectional view illustrating a main part of the process of manufacturing the semiconductor device according to the embodiment.

Subsequently, parts of the insulating film 78 are removed by, for example, wet etching. The parts of the removed insulating film become the first insulating film 70, the third insulating film 74, and the fourth insulating film 76, respectively (FIG. 4). Although the parts of the insulating film 78 may be removed by dry etching, wet etching is preferable because it is considered that wet etching causes less damage to the surface of the second nitride semiconductor layer 8.

Figure 5:
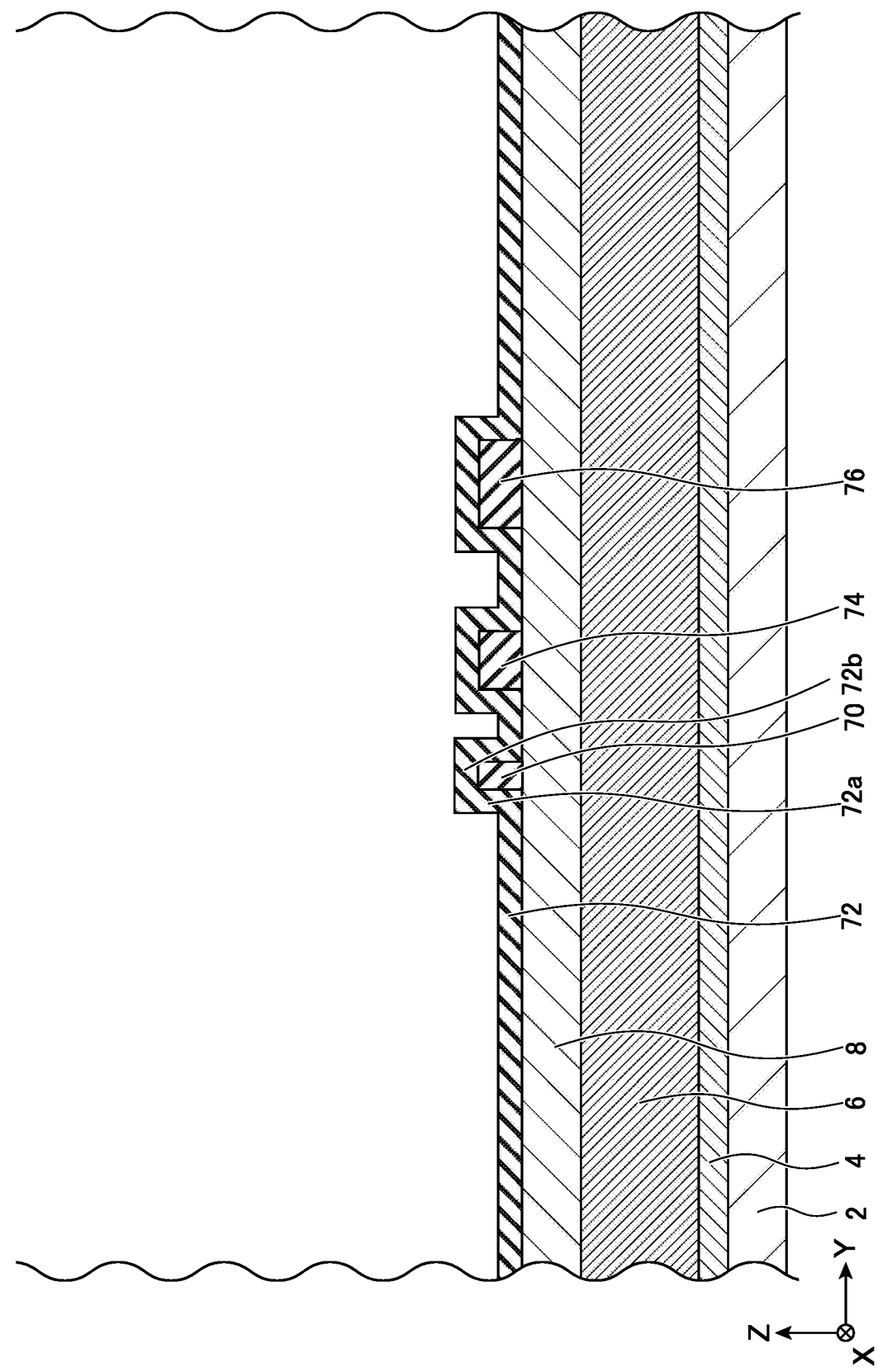
FIG. 5 is a schematic cross-sectional view illustrating a main part of the process of manufacturing the semiconductor device according to the embodiment.

Subsequently, the second insulating film 72 is formed on the second nitride semiconductor layer 8, the first insulating film 70, the third insulating film 74, and the fourth insulating film 76 (FIG. 5).

Figure 6:
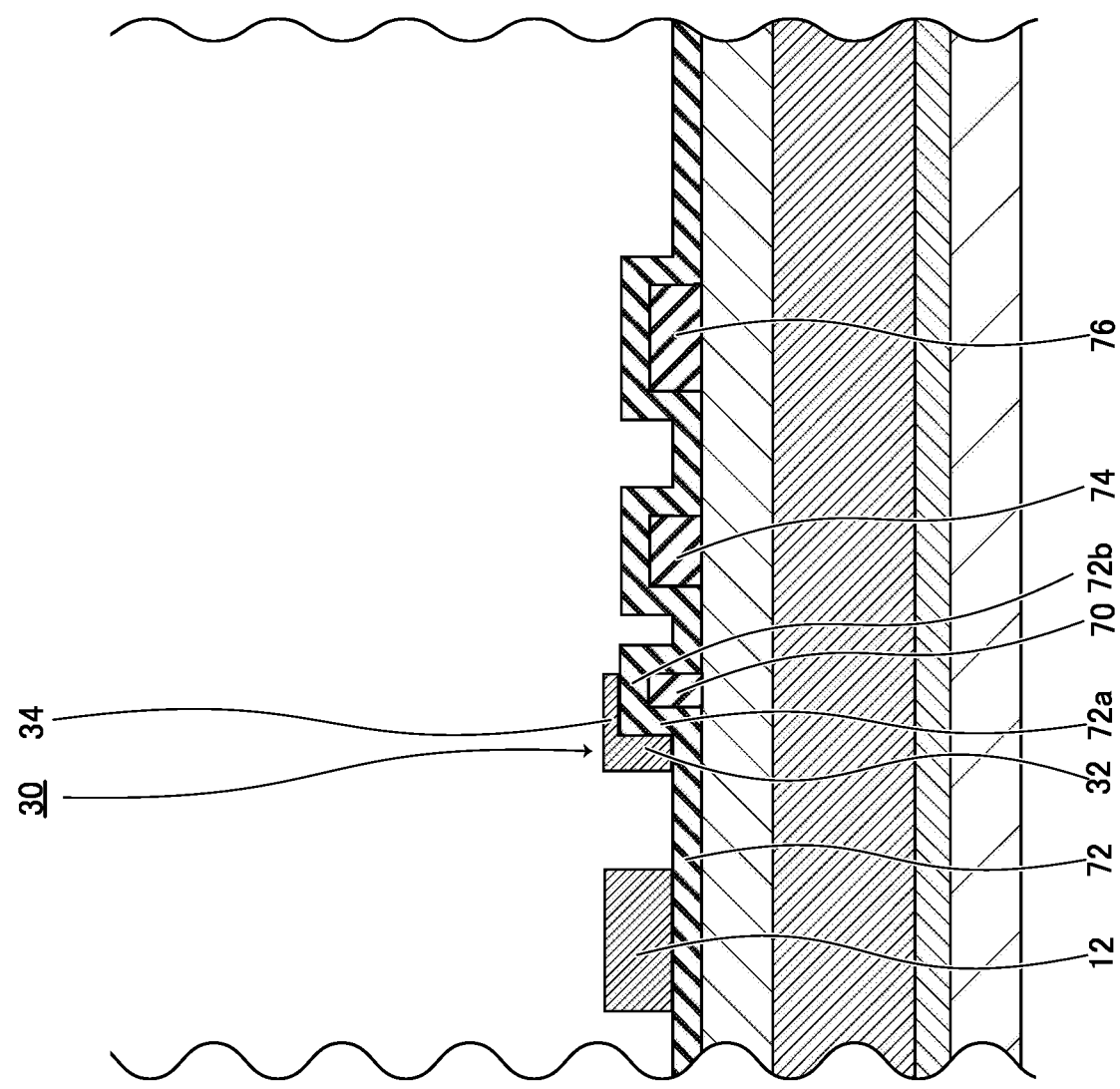
FIG. 6 is a schematic cross-sectional view illustrating a main part of the process of manufacturing the semiconductor device according to the embodiment.

Subsequently, the gate electrode 12 is formed on a left side of the first insulating film 70 on the second insulating film 72. The first field plate electrode 30 is formed on a side surface of the second insulating film 72a formed on the side surface of the first insulating film 70 and an upper surface of the second insulating film 72b formed on the upper surface of the first insulating film 70. At this time, the first electrode portion 32 is formed on the side surface of the second insulating film 72a. The second electrode portion 34 is formed on an upper surface of the second insulating film 72b (FIG. 6).

Figure 7:
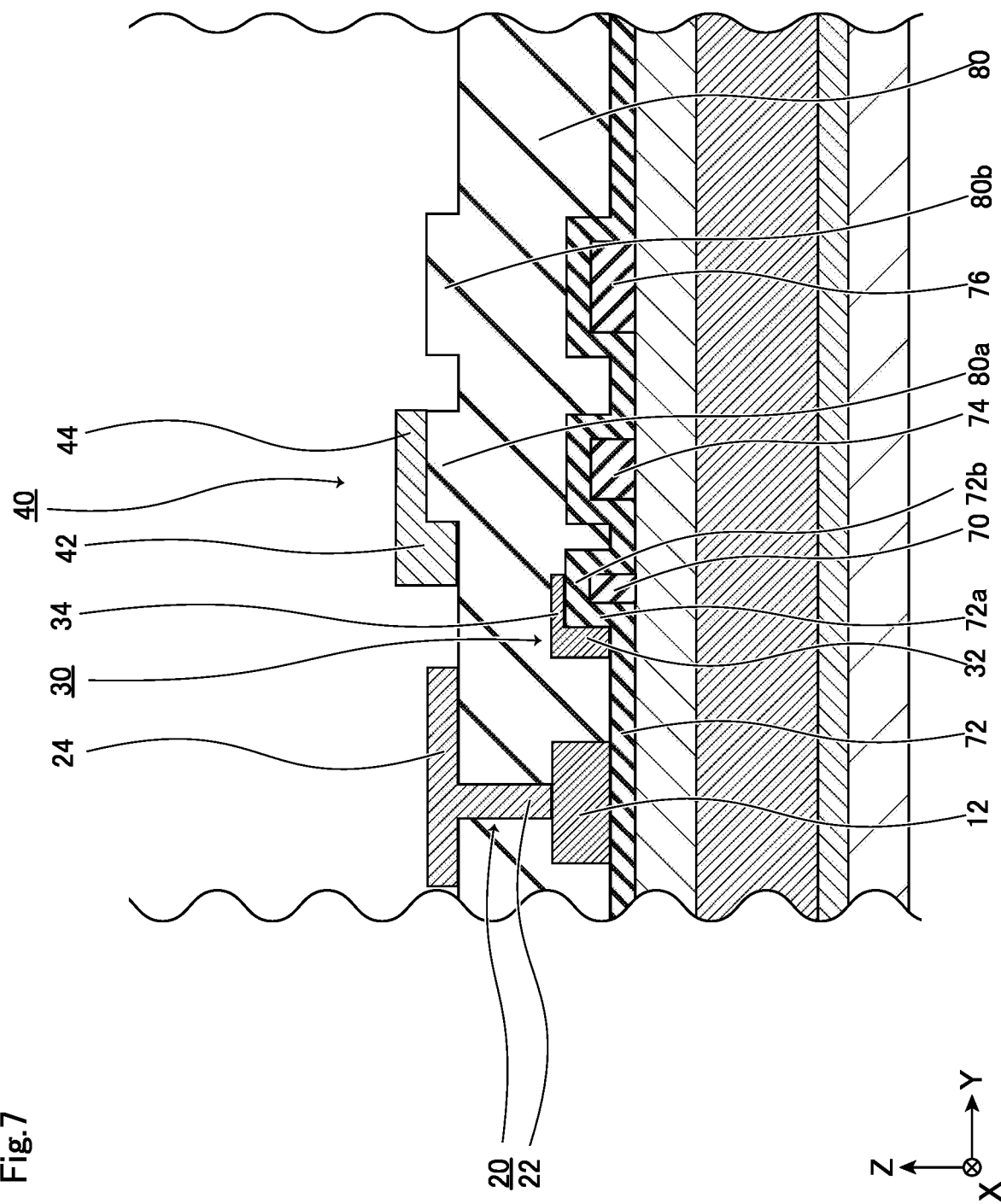
FIG. 7 is a schematic cross-sectional view illustrating a main part of the process of manufacturing the semiconductor device according to the embodiment.

FIG. 7 is a diagram when the fifth insulating film 80 and the second field plate electrode 40 are formed. A protrusion portion of the fifth insulating film 80 such as the fifth insulating film 80a is formed on the fifth insulating film 80 formed on the second insulating film 72 on the third insulating film 74. When the fifth insulating film 80 is formed, a protrusion portion of the fifth insulating film 80 such as the fifth insulating film 80b is formed on the fifth insulating film 80 formed on the second insulating film 72 on the fourth insulating film 76. The third electrode portion 42 is formed on a side surface of the fifth insulating film 80a, and the fourth electrode portion 44 is formed on an upper surface of the fifth insulating film 80a.

Figure 8:
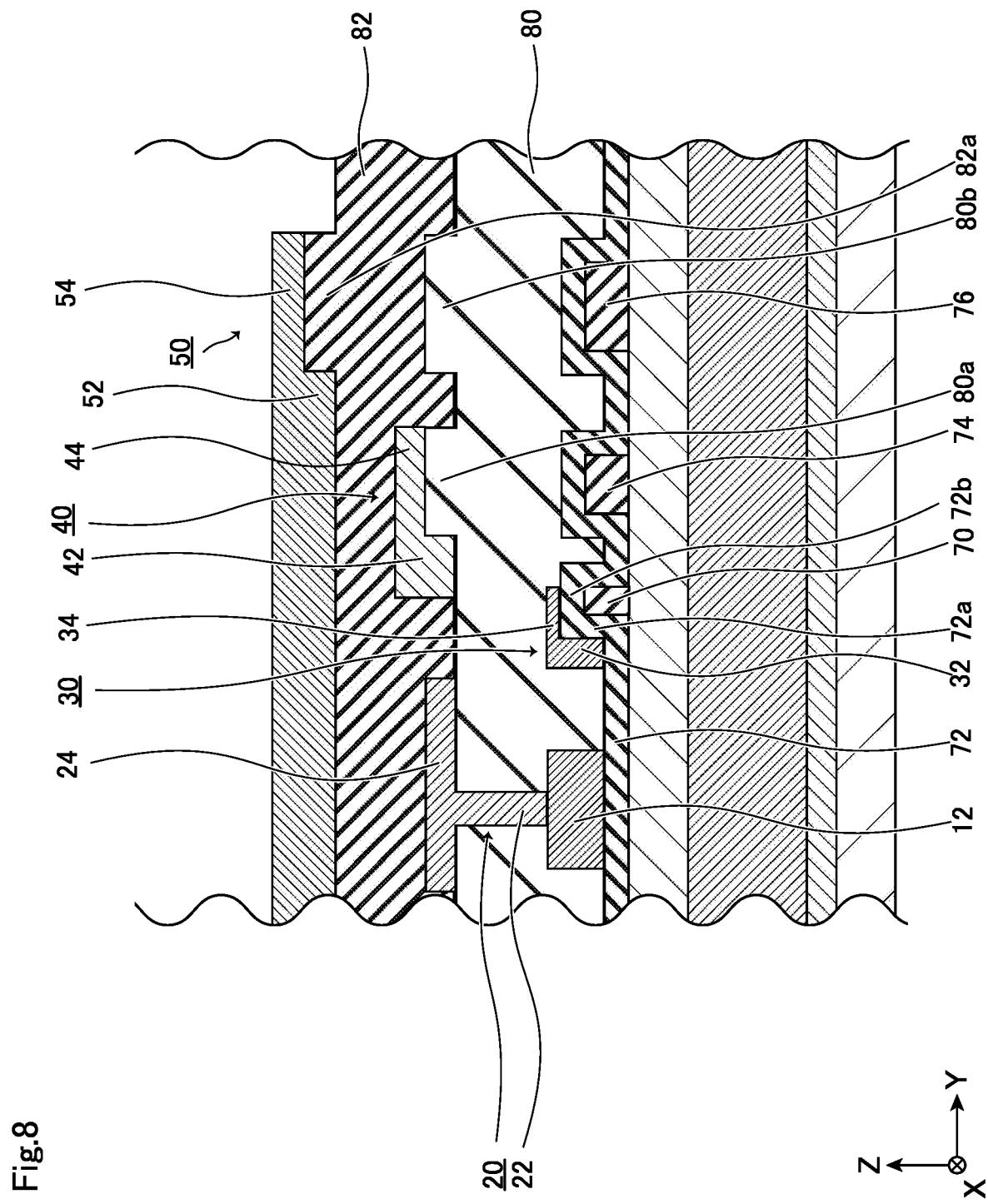
FIG. 8 is a schematic cross-sectional view illustrating a main part of the process of manufacturing the semiconductor device according to the embodiment.

FIG. 8 is a diagram when the sixth insulating film 82 and the source field plate electrode 50 are formed. A protrusion portion of the sixth insulating film 82 such as the sixth insulating film 82a is formed on the sixth insulating film 82 formed on the fifth insulating film 80b. The fifth electrode portion 52 is formed on a side surface of the sixth insulating film 82a, and the sixth electrode portion 54 is formed on an upper surface of the sixth insulating film 82a.

Next, actions and effects of the semiconductor device according to the embodiment will be described.

Figure 9:
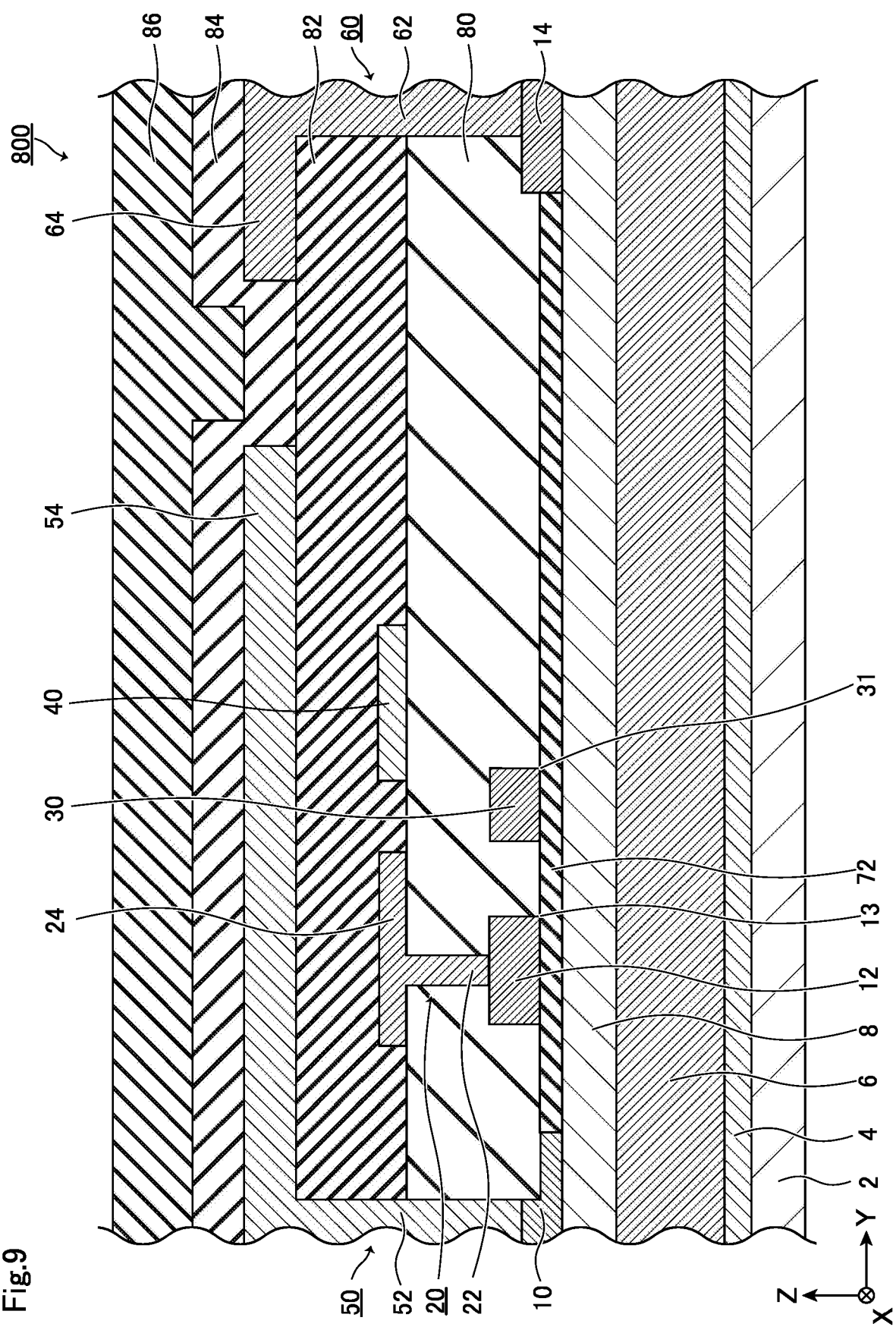
FIG. 9 is a schematic cross-sectional view of a semiconductor device as a comparative form.

FIG. 9 is a schematic cross-sectional view of a semiconductor device 800 as a comparative form.

In the semiconductor device using the lateral nitride semiconductor, it is difficult to achieve both reduction in electric field intensity around the gate electrode on the drain electrode side and reduction in gate-drain capacitance (Cgd). In the semiconductor device 800 as the comparative form, the first field plate electrode 30 is provided on the second insulating film 72 between the gate electrode 12 and the drain electrode 14. Accordingly, it is possible to achieve both reduction in the electric field intensity around the gate electrode on the drain electrode side and the reduction in the gate-drain capacitance (Cgd). However, along with the miniaturization of the semiconductor device, when a gate-drain distance is shortened, the electric field intensity on the drain electrode side of the first field plate electrode 30, particularly, an end portion 31 of the first field plate electrode 30 increases, and thus, there is a problem that the reliability of the semiconductor device decreases. Even though the first field plate electrode 30 is not provided, the electric field intensity on the drain electrode side of the gate electrode 12 increases, and thus, there is a problem that and the reliability of the semiconductor device decreases.

Figure 10:
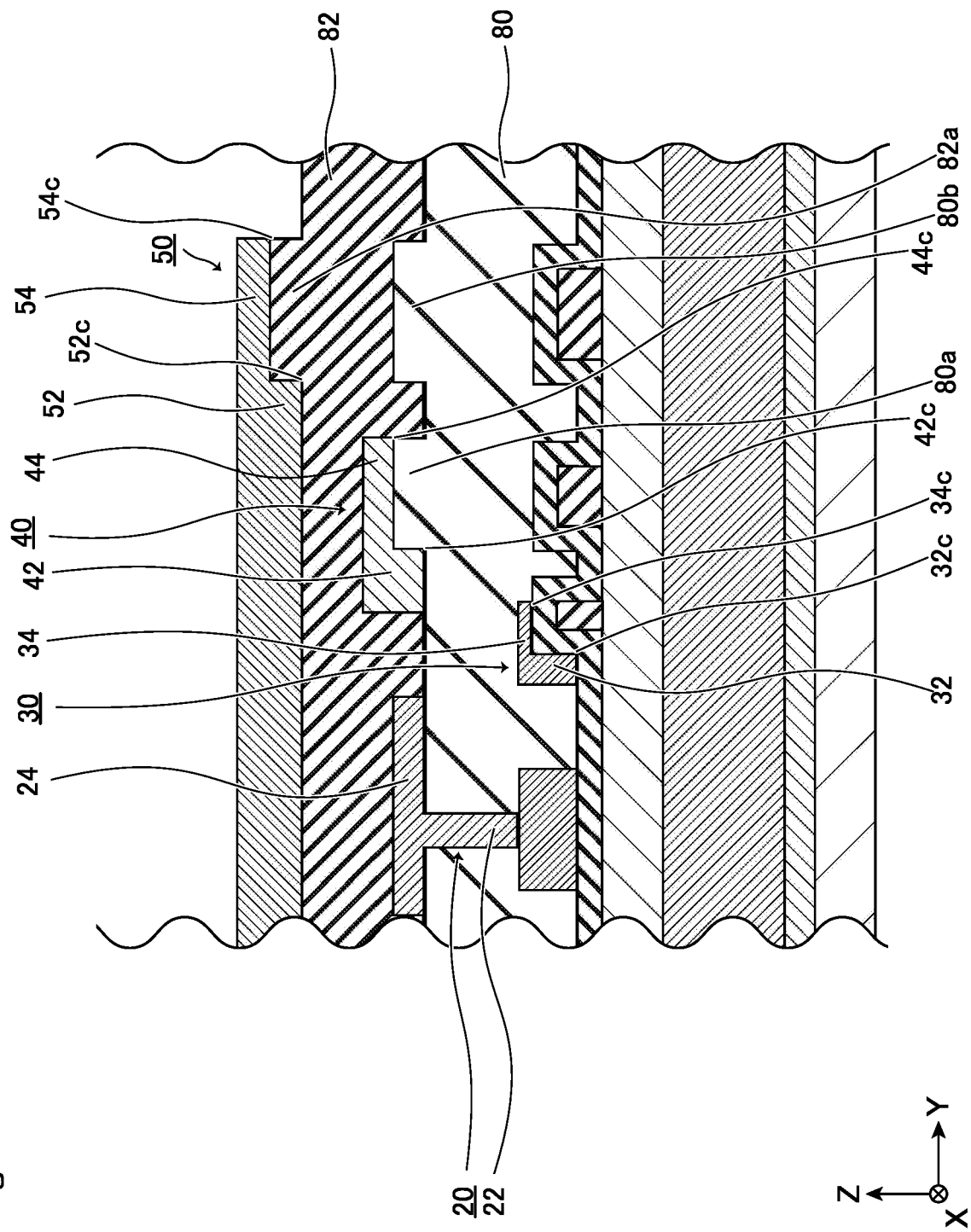
FIG. 10 is a schematic cross-sectional view for describing actions and effects of the semiconductor device according to the embodiment.

Thus, in the semiconductor device according to the embodiment, the first field plate electrode 30 including the first electrode portion 32 provided on the second insulating film 72 between the gate electrode 12 and the first insulating film 70 and the second electrode portion 34 provided on the second insulating film 72 on the first insulating film 70 and electrically connected to the first electrode portion 32 is provided. Accordingly, it is possible to provide the first field plate electrode 30 without the end portion 31 (FIG. 9). FIG. 10 is a schematic cross-sectional view for describing actions and effects of the semiconductor device according to the embodiment. In other words, in the semiconductor device 800 as the comparative form, the electric field intensity concentrated on the end portion 31 (FIG. 9) can be dispersed to an end portion 32c on the bottom surface of the first electrode portion 32 close to the drain electrode 14 and an end portion 34c on the bottom surface of the second electrode portion 34 close to the drain electrode 14. Accordingly, it is possible to provide a semiconductor device with improved reliability.

In the semiconductor device according to the embodiment, the second field plate electrode 40 including the third electrode portion 42 provided above the second insulating film 72 between the first insulating film 70 and the third insulating film 74, and the fourth electrode portion 44 provided above the second insulating film 72 on the third insulating film 74 and electrically connected to the third electrode portion 42 is provided. Accordingly, the electric field intensity can be further dispersed to an end portion 42c on the bottom surface of the fourth electrode portion 44 close to the drain electrode 14 and an end portion 44c on the bottom surface of the fourth electrode portion 44 close to the drain electrode 14. Accordingly, it is possible to provide a semiconductor device with improved reliability.

In the semiconductor device according to the embodiment, the source field plate electrode 50 including the fifth electrode portion 52 provided above the second insulating film 72 between the third insulating film 74 and the fourth insulating film 76 and the sixth electrode portion 54 provided above the second insulating film 72 on the fourth insulating film 76 and electrically connected to the fifth electrode portion 52 is provided. Accordingly, the electric field intensity can be further dispersed to an end portion 52c on the bottom surface of the fifth electrode portion 52 close to the drain electrode 14 and an end portion 54c on the bottom surface of the sixth electrode portion 54 close to the drain electrode 14. Accordingly, it is possible to provide a semiconductor device with improved reliability.

The length of the first insulating film 70 in the Y direction is preferably shorter than the length of the first field plate electrode 30 in the Y direction. The first field plate electrode 30 includes the second electrode portion 34 formed by using the upper surface of the first insulating film 70 and the first electrode portion 32 formed by using the side surface of the first insulating film 70. Thus, the length of the first field plate electrode 30 in the Y direction is longer than the length of the first insulating film 70 in the Y direction by at least the first electrode portion 32.

A length of the third insulating film 74 in the Y direction is preferably shorter than a length of the second field plate electrode 40 in the Y direction. The second field plate electrode 40 includes the fourth electrode portion 44 formed by using the upper surface of the fifth insulating film 80a and the third electrode portion 42 formed by using the side surface of the fifth insulating film 80a. Here, the fifth insulating film 80a is formed above the third insulating film 74. Thus, it is considered that a length of the fifth insulating film 80a in the Y direction is equal to or more than the length of the third insulating film 74 in the Y direction. Accordingly, it is considered that a length of the fourth electrode portion 44 in the Y direction is equal to the length of the fifth insulating film 80a in the Y direction. The second field plate electrode 40 further includes the third electrode portion 42. Thus, the length of the third insulating film 74 in the Y direction is shorter than the length of the second field plate electrode 40 in the Y direction.

Similarly, the length of the fourth insulating film 76 in the Y direction is preferably shorter than the length of the source field plate electrode 50 in the Y direction.

The length $L_1$ of the first insulating film 70 in the direction parallel to the Y direction is preferably equal to or less than the length $L_2$ of the third insulating film 74 in the direction parallel to the Y direction. The length $L_2$ of the third insulating film 74 in the direction parallel to the Y direction is preferably equal to or less than the length $L_3$ of the fourth insulating film 76 in the direction parallel to the Y direction. In other words, $L_1 \leq L_2 \leq L_3$ is preferable. This is because the concentration of the electric field intensity is avoided by appropriately dispersing and disposing the end portion 32c, the end portion 34c, the end portion 42c, the end portion 44c, the end portion 52c, and the end portion 54c when viewed from the drain electrode 14.

The first insulating material and the second insulating material are preferably different from each other. This is because the concentration of the electric field intensity is avoided by appropriately controlling the dielectric constant of the first insulating material and the dielectric constant of the second insulating material. In particular, from this viewpoint, the dielectric constant of the first insulating material is preferably lower than the dielectric constant of the second insulating material.

The bottom surface of the first electrode portion 32, the side surface of the first electrode portion 32, and the bottom surface of the second electrode portion 34 are preferably in contact with the second insulating film 72. This is because the first field plate electrode 30 can be easily formed by forming the first field plate electrode 30 in this manner.

According to the semiconductor device according to the embodiment, it is possible to provide a semiconductor device with improved reliability.

While certain embodiments have been described, these embodiments have been presented by way of example only, and are not intended to limit the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a first nitride semiconductor layer;
   a second nitride semiconductor layer provided on the first nitride semiconductor layer and the second nitride semiconductor layer having a band gap larger than the first nitride semiconductor layer;
   a first electrode provided on the second nitride semiconductor layer;
   a second electrode provided on the second nitride semiconductor layer;
   a first insulating film provided between the first electrode and the second electrode on the second nitride semiconductor layer, the first insulating film being in contact with the second nitride semiconductor layer and the first insulating film including a first insulating material;
   a second insulating film provided on the second nitride semiconductor layer between the first electrode and the first insulating film, the second insulating film being provided on the first insulating film, the second insulating film being provided on the second nitride semiconductor layer between the first insulating film and the second electrode and the second insulating film including a second insulating material;
   a third electrode provided on the second insulating film between the first electrode and the first insulating film, the second insulating film being provided between the second nitride semiconductor layer and the third electrode in a first direction from the first nitride semiconductor layer to the second nitride semiconductor layer;
   a fourth electrode including a first electrode portion and a second electrode portion, the first electrode portion being provided on the second insulating film between the third electrode and the first insulating film in a second direction horizontally crossing the first direction, the second electrode portion being provided on the second insulating film, and the second insulating film provided on the first insulating film, and the second electrode portion being electrically connected to the first electrode portion, and the first electrode portion being provided between the third electrode and the second electrode portion in the second direction;
   a third insulating film provided between the first insulating film and the second electrode and between the second nitride semiconductor layer and the second insulating film, the third insulating film being in contact with the second nitride semiconductor layer and the third insulating film including the first insulating material; and
   a fifth electrode including a third electrode portion and a fourth electrode portion, the third electrode portion being provided above the second insulating film between the first insulating film and the third insulating film, the fourth electrode portion being provided above the second insulating film on the third insulating film and the fourth electrode portion being electrically connected to the third electrode portion.

2. The semiconductor device according to claim 1, wherein a length of the first insulating film in the second direction is shorter than a length of the fourth electrode in the second direction.

3. The semiconductor device according to claim 1, wherein a bottom surface of the first electrode portion, a side surface of the first electrode portion, and a bottom surface of the second electrode portion are in contact with the second insulating film.

4. The semiconductor device according to claim 1, wherein the first insulating material and the second insulating material are different.

5. The semiconductor device according to claim 4, wherein a dielectric constant of the first insulating material is lower than a dielectric constant of the second insulating material.

6. The semiconductor device according to claim 1, wherein
   a length of the third insulating film in the second direction is shorter than a length of the fifth electrode in the second direction.

7. The semiconductor device according to claim 1, wherein
   a length of the first insulating film in the second direction is equal to or less than a length of the third insulating film in the second direction.

8. The semiconductor device according to claim 1, further comprising:
   a fifth insulating film provided between the second insulating film and the fifth electrode.

9. The semiconductor device according to claim 1, further comprising:
   a fourth insulating film provided between the third insulating film and the second electrode and between the second nitride semiconductor layer and the second insulating film, the fourth insulating film being in contact with the second nitride semiconductor layer and the fourth insulating film including the first insulating material; and a sixth electrode including a fifth electrode portion and a sixth electrode portion, the fifth electrode being provided above the second insulating film between the third insulating film and the fourth insulating film, the sixth electrode portion being provided above the second insulating film on the fourth insulating film and the sixth electrode portion being electrically connected to the fifth electrode portion.

10. The semiconductor device according to claim 9, wherein a length of the fourth insulating film in the second direction is shorter than a length of the sixth electrode in the second direction.

11. The semiconductor device according to claim 9, further comprising:

a fifth insulating film provided between second insulating film and the fifth electrode and between the second insulating film and the sixth electrode; and a sixth insulating film provided between the fifth insulating film and the sixth electrode.

12. A semiconductor device comprising:

a first nitride semiconductor layer;

a second nitride semiconductor layer provided on the first nitride semiconductor layer and the second nitride semiconductor layer having a band gap larger than the first nitride semiconductor layer;

a first electrode provided on the second nitride semiconductor layer;

a second electrode provided on the second nitride semiconductor layer;

a first insulating film provided between the first electrode and the second electrode on the second nitride semiconductor layer, the first insulating film being in contact with the second nitride semiconductor layer and the first insulating film including a first insulating material;

a second insulating film provided on the second nitride semiconductor layer between the first electrode and the first insulating film, the second insulating film being provided on the first insulating film, the second insulating film being provided on the second nitride semiconductor layer between the first insulating film and the second electrode and the second insulating film including a second insulating material;

a third electrode provided on the second insulating film between the first electrode and the first insulating film, the second insulating film being provided between the second nitride semiconductor layer and the third electrode in a first direction from the first nitride semiconductor layer to the second nitride semiconductor layer;

a fourth electrode including a first electrode portion and a second electrode portion, the first electrode portion being provided above the second insulating film between the third electrode and the first insulating film in a second direction horizontally crossing the first direction, the second electrode portion being provided above the second insulating film, and the second insulating film provided on the first insulating film, and the second electrode portion being electrically connected to the first electrode portion, and the first electrode portion being provided between the third electrode and the second electrode portion in the second direction;

a fifth insulating film provided between the fourth electrode and the second insulating film;

a third insulating film provided between the first insulating film and the second electrode and between the second nitride semiconductor layer and the second insulating film, the third insulating film being in contact with the second nitride semiconductor layer and the third insulating film including the first insulating material; and a fifth electrode including a third electrode portion and a fourth electrode portion, the third electrode portion being provided above the second insulating film between the first insulating film and the third insulating film, the fourth electrode portion being provided above the second insulating film on the third insulating film and the fourth electrode portion being electrically connected to the third electrode portion.

13. The semiconductor device according to claim 12, wherein a length of the first insulating film in the second direction is shorter than a length of the fourth electrode in the second direction.

14. The semiconductor device according to claim 12, wherein a bottom surface of the first electrode portion, a side surface of the first electrode portion, and a bottom surface of the second electrode portion are in contact with the second insulating film.

15. The semiconductor device according to claim 12, wherein the first insulating material and the second insulating material are different.

16. The semiconductor device according to claim 15, wherein a dielectric constant of the first insulating material is lower than a dielectric constant of the second insulating material.

* * * * *